United States Patent [19]

Iadanza et al.

[11] Patent Number: 5,663,670

[45] Date of Patent: Sep. 2, 1997

[54] CONTROLLABLE VARIABLE DELAY INVERTER FOR A PROCESS TOLERANT DELAY CIRCUIT

[75] Inventors: Joseph Andrew Iadanza, Hinesburg, Vt.; Makoto Ueda, Kyoto, Japan

[73] Assignee: International Business Machines Corporation, Armonk, N.Y.

[21] Appl. No.: 646,899

[22] Filed: May 8, 1996

Related U.S. Application Data

[62] Division of Ser. No. 402,280, Mar. 10, 1995, Pat. No. 5,548,237.

[51] Int. Cl.⁶ .................................................. H03H 11/26
[52] U.S. Cl. ........................................ 327/281; 327/288
[58] Field of Search .............................. 327/264, 276, 327/277, 278, 281, 283, 284, 285, 288, 309, 374, 379, 389, 391, 427; 326/23, 27

[56] References Cited

U.S. PATENT DOCUMENTS

| | | | |
|---|---|---|---|
| 4,494,021 | 1/1985 | Bell et al. | 327/284 |
| 4,720,670 | 1/1988 | Boyle | 324/73 R |
| 4,922,141 | 5/1990 | Lofgren et al. | 327/158 |
| 5,012,141 | 4/1991 | Tomisawa | 327/276 |
| 5,021,684 | 6/1991 | Ahuja et al. | 307/443 |
| 5,051,630 | 9/1991 | Kogan et al. | 307/603 |
| 5,055,715 | 10/1991 | Inaba | 307/443 |
| 5,059,838 | 10/1991 | Motegi et al. | 327/277 |
| 5,121,014 | 6/1992 | Huang | 327/276 |
| 5,179,303 | 1/1993 | Searles et al. | 327/277 |
| 5,223,755 | 6/1993 | Richley | 327/277 |
| 5,231,319 | 7/1993 | Crafts et al. | 307/603 |
| 5,252,867 | 10/1993 | Sorrells et al. | 327/271 |
| 5,300,837 | 4/1994 | Fischer | 307/491 |
| 5,341,031 | 8/1994 | Kinoshita et al. | 327/285 |
| 5,349,311 | 9/1994 | Mentzer | 331/57 |
| 5,355,037 | 10/1994 | Andresen et al. | 327/277 |
| 5,440,260 | 8/1995 | Hayashi et al. | 327/278 |
| 5,451,894 | 9/1995 | Guo | 327/277 |
| 5,459,424 | 10/1995 | Hattori | 327/288 |
| 5,497,263 | 3/1996 | Masuda et al. | 327/278 |

OTHER PUBLICATIONS

IBM Technical Disclosure Bulletin, "Process Tracking Delay Element", Author—M. Ueda; vol. 36, No. 09A, Sep. 1993.

*Primary Examiner*—Timothy P. Callahan
*Assistant Examiner*—My-Trang Nu Ton
*Attorney, Agent, or Firm*—Heslin & Rothenberg, P.C.

[57] ABSTRACT

A process tolerant delay circuit includes a plurality of inverters that receive an input signal and provide an output signal related to the input signal but including a propagation delay of the plurality of inverters. At least one inverter comprises FETs of minimum channel lengths dependent upon a fabrication process by which the circuit was made. Accordingly, the plurality of inverters have a propagation delay dependent upon the fabrication process. A delay compensation device receives the output signal of the inverters and provides a compensated output signal related to the received signal but including a variable delay established in accordance with a control signal. A process sense stack provides the control signal only during a transition of the input signal, and with a value dependent upon a channel length of a FET device thereof. Thus, the plurality of inverters and delay compensation device operate together, per the control signal of the process sense stack, to provide a circuit capable of compensating for process degradations in order to provide a given delay in accordance with variations in the fabrication process by which they were made.

6 Claims, 2 Drawing Sheets

CONTROLLABLE VARIABLE DELAY INVERTER FOR A PROCESS TOLERANT DELAY CIRCUIT

CROSS-REFERENCE TO RELATED APPLICATIONS

This application is a divisional of patent application Ser. No. 08/402,280 filed Mar. 10, 1995, U.S. Pat. No. 5,548,237 issued Aug. 20, 1996 and entitled "PROCESS TOLERANT DELAY CIRCUIT".

This application is related to U.S. patent application Ser. No. 08/656,801, filed on May 31, 1996 and entitled "PROCESS TOLERANT DELAY CIRCUIT," which itself is a continuation of said U.S. Pat. No. 5,548,237.

TECHNICAL FIELD

This invention relates to a delay circuit. More specifically, the invention relates to a delay circuit which is tolerant of variations in the process by which the delay circuit is fabricated.

BACKGROUND ART

Sequential data paths in logic designs often require timing adjustments in order to overcome race conditions and other timing problems. Traditionally, such timing adjustments have included the insertion of buffers, or delay circuits within a specific path for increasing the propagation time of a given signal. However, performance characteristics of known buffers have been dependent upon parameters of a process by which the buffers have been fabricated. As the operating speed Of existing logic devices increases, it is necessary to provide buffer circuits having known delays that do not vary with respect to processing parameters.

In fabricating a Field Effect Transistor (FET) device, its resulting channel length will vary in accordance with the characteristics of the process by which the FET device is fabricated. The channel length of the FET device will vary from a nominal length by a $\Delta L$ in accordance with the processing results and its series on-resistance will likewise vary from a nominal resistance proportionate to $\Delta L/$ (nominal gate length). For fixed values of $\Delta L$, it can be seen that the percentage of variation, i.e. ($\Delta L$)/(nominal channel length), will be much greater for short channel length devices in contrast to long channel length devices. A short channel length device characterizes a FET device having a channel length corresponding to a minimum channel length available from a given process (e.g., 0.5 μm). A long channel length device characterizes a FET device having a channel length at least 1.5 times greater than the minimum channel length available from the given process (e.g., >0.75 μm).

If a buffer circuit employs certain channel length FETs for driving a fixed capacitive load, the buffer will exhibit a propagation delay proportional to the RC time constant associated with the series on resistance R of the output FETs and the capacitance C of the capacitive load. With the propagation delay of the buffer being dependent upon the series on-resistance of the FET, and the percentage of variation in series on-resistance with respect to processing parameters being greater for short channel length devices in contrast to long channel length devices, it follows that a buffer employing short channel length FETs will exhibit proportionately greater variations in propagation delay with respect to processing parameters than will a buffer employing long channel length FETs. Thus, a buffer employing short channel length FETs has a propagation delay greatly dependent upon the process by which it is fabricated while a buffer employing long channel length FETs provides a propagation delay that is only slightly dependent upon the process by which it is fabricated.

DISCLOSURE OF INVENTION

It is thus an object of the present invention to provide an improved delay circuit which provides a known delay independent and tolerant of variations in the parameters of the process by which it is fabricated.

It is a further object of the present invention to provide a delay circuit having a low device count.

It is another object of the present invention to provide a delay circuit of minimal power consumption.

In furtherance of these objectives, the present invention provides a transitional, zero standby current, process sense stack. The sense stack includes a functional resistor network that divides a fixed voltage, during transitions of an input signal only, in accordance with the effects of the process by which it was fabricated. Certain resistance values of the functional resistor network vary as a function of parameters of the process by which it was fabricated.

In accordance with another embodiment of the present invention, a delay circuit incudes a plurality of inverters, a delay compensation device and a process sense stack. The plurality of inverters have at least one inverter that comprises FET devices of minimum channel length dependent upon the fabrication process by which they were made. The plurality of inverters are in a serial sequence and accordingly have an overall propagation delay associated therewith that is dependent upon the channel lengths of the minimum channel length FET devices. The plurality of inverters receive an input signal and provide an output signal that is related to the input signal including the propagation delay of the inverters. The delay compensation device receives the output signal from the plurality of inverters and provides a compensated output signal at an output terminal related to the received signal but including a variable delay established in accordance with a control signal of the process sense stack. The process sense stack provides the control signal only when a signal transition at the input is received and of a value dependent upon a channel length of a FET device of the process sense stack.

In accordance with another embodiment of the present invention, a delay circuit comprises a sequence of inverters. One inverter of the sequence has a propagation delay directly related to a given parameter of the process by which the sequence of inverters were made. Another inverter of the sequence has a propagation delay inversely related to the given process parameter.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
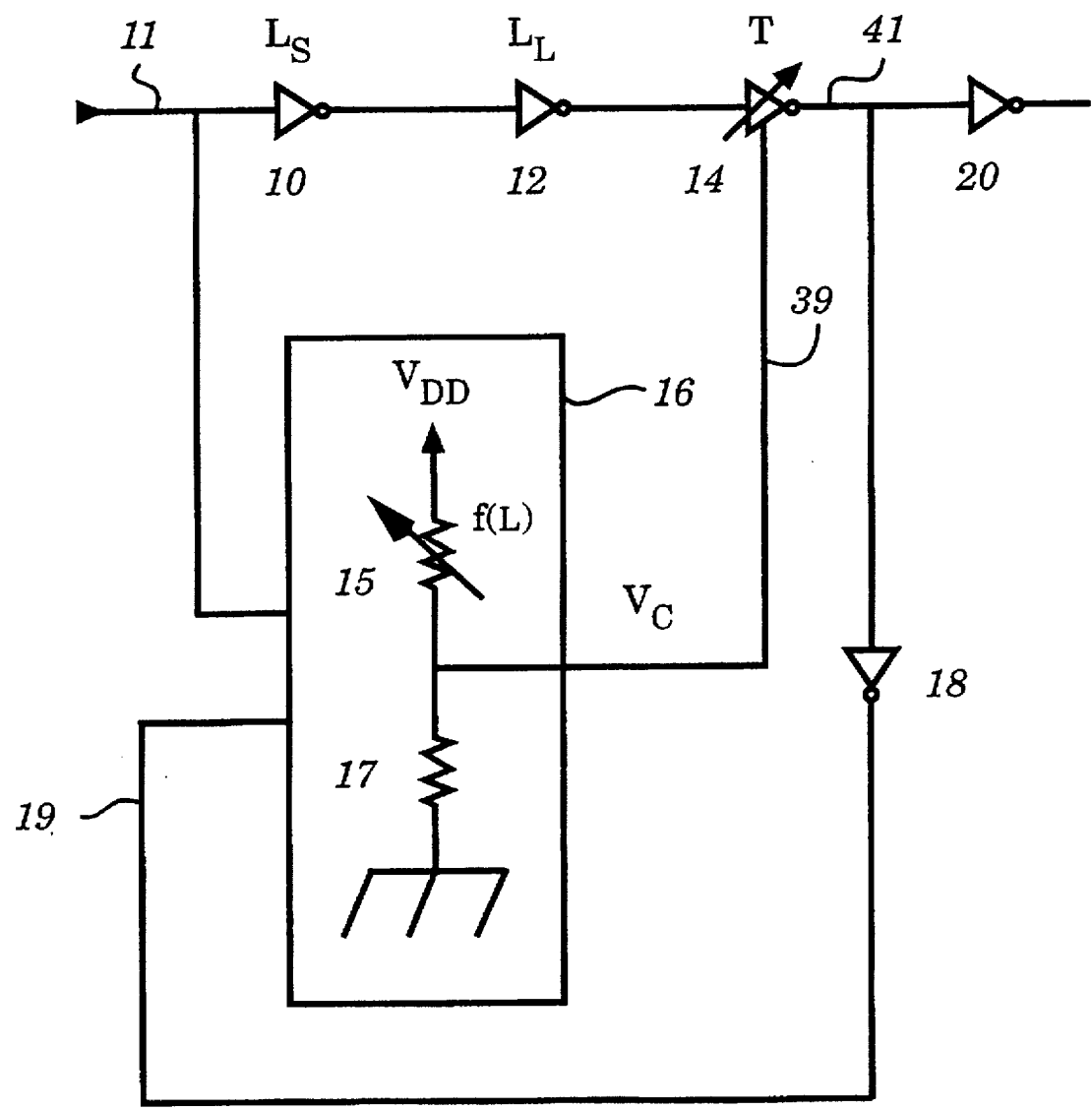
FIG. 1 is a functional block diagram representative of the present invention.

A delay circuit of the present invention functions according to the block diagram of FIG. 1. Primary input 11 is connected to an inverter 10, which comprises FETs of minimum channel length. The channel length of the minimum channel length FETs is dependent upon parameters of the process by which the FETs were fabricated. Thus, as the processing parameters change, so too will the channel length and the associated series on-resistance of the minimum channel length FETs. The series on-resistance of the minimum channel length FETs provide the output resistance of inverter 10, which drives a fixed capacitive load at the input of inverter 12. The output resistance R of inverter 10 and the input capacitance C of inverter 12 define an RC time constant that sets the propagation delay of inverter 10. Because the channel length of the minimum channel length FETs making up inverter 10 depend upon process parameters of the process by which they were fabricated, so too will the propagation delay associated with inverter 10 depend upon the process parameters.

Inverter 12 which includes only long channel length FETs inverts the signal received from inverter 10. The series on-resistance associated with the long channel length FETs of inverter 12 do not vary proportionately as much as the minimum channel length FETs of inverter 10. Therefore, the output resistance of inverter 12 can be viewed primarily as constant in contrast to the output resistance associated with inverter 10, and inverter 12 can be viewed as providing substantially a fixed propagation delay, with respect to the process parameters by which it was made, relative to inverter 10.

The output of inverter 12 is tied to variable delay inverter 14, which has a propagation delay T that changes in accordance with a control voltage $V_c$ received at control node 39'. The output of inverter 14 drives output node 41 which is tied to the input of FET inverter 20 and FET inverter 18. FET inverter 18 is made with minimum channel length FET devices. The channel lengths for the FETs of inverter 20 are selected for providing a desired delay.

Process sense stack 16 receives two input signals, a primary input signal received from input node 11 and a secondary input signal at node 19 fed back from variable delay inverter 14 via inverter 18. Inverter 18 inverts the signal of node 41 and sends the inverted signal to the secondary input of process sense stack 16. The signal presented to the secondary input corresponds to the input signal at input 11 delayed by the combined propagation delays of inverters 10, 12, 14, and 18.

Process sense stack 16 is a voltage divider network which provides control voltage $V_c$ at node 39 to control variable delay inverter 14. The primary and secondary input signals of the process sense stack 16 are used to determine when the voltage divider network is to function. The voltage divider network does not function when the voltages received at its primary and secondary input nodes 11, 19, are the same. However, when the inputs have different voltages, the voltage divider network divides a fixed voltage for providing control voltage $V_c$. Thus, the voltage divider network of process sense stack 16 supplies control voltage $V_c$ only when the primary and secondary input nodes 11, 19 receive different voltages, i.e. upon receiving a signal transition at input node 11.

Assuming a signal transition is received at input 11, and that the voltages at the primary and secondary inputs are different, then the voltage divider network of process sense stack 16 functions appropriately to divide a fixed voltage and output control voltage $V_c$. Resistors 15 and 17 represent functionally the makeup of the voltage divider network within process sense stack 16. Resistor 17 includes a long channel length FET that presents substantially a constant resistance with respect to process parameters of the process by which it was made. Resistor 15, on the other hand, includes minimum length channel FETs that present resistance values dependent upon the processing parameters of the process by which they were made. As the process favors a worst case (WC) condition, the channel lengths of the minimum channel length FETs increase and so too will their associated resistance values, i.e. large resistance for resistor 15. On the other hand, when the process favors a best case (BC) condition, the channel lengths of the minimum channel length FETs decrease along with their associated resistance values, i.e. small resistance for resistor 15. Thus, control voltage $V_c$ has a minimum voltage level when the processing parameters favor the worst case processing condition and the resistance value of resistor 15 is at a maximum extreme. On the other hand, when the processing conditions favor the best case processing condition, the resistance of resistor 15 is at a minimum extreme and control voltage $V_c$ is at a maximum voltage level for driving control node 39 of the variable delay inverter 14.

When the control voltage $V_c$ at control node 39 is at a maximum level, the variable delay inverter 14 provides its maximum delay. This occurs when the process sense stack 16 senses the best case processing condition. Accordingly, the FETs of inverter 10, fabricated by the same process, have their shortest channel length and provide inverter 10 its minimum propagation delay. At the other extreme, when control voltage $V_c$ is at a minimum voltage level, the delay provided by variable delay inverter 14 is minimum. This occurs when the process sense stack 16 senses the worst case processing condition. Under the worst case processing conditions, the FETs of inverter 10 have their longest channel length and inverter 10 has its maximum propagation delay.

Under best case processing conditions, inverter 10 provides its minimum propagation delay and variable delay inverter 14 provides its maximum propagation delay, per a maximum control voltage $V_c$ at control node 39 as supplied by process sense stack 16. Conversely, under a worst case processing conditions, inverter 10 has its maximum propagation delay and variable delay inverter 14 provides its minimum propagation delay, per a minimum control voltage $V_c$ as supplied by process sense stack 16. Thus, the effect of variable delay inverter 14 is to provide a variable propagation delay that is inversely proportional to the propagation delay of inverter 10 so that the combined propagation delay of inverter 10 and inverter 14 is constant irregardless of the process by which they were fabricated. In this fashion the delay circuit compensates for process deviations so as to provide a known delay tolerant of variations in the process by which it was fabricated. The delay circuit can provide a decreasing, fixed, or slightly increasing delay in accordance with the process $\Delta L$ conditions.

Figure 2:
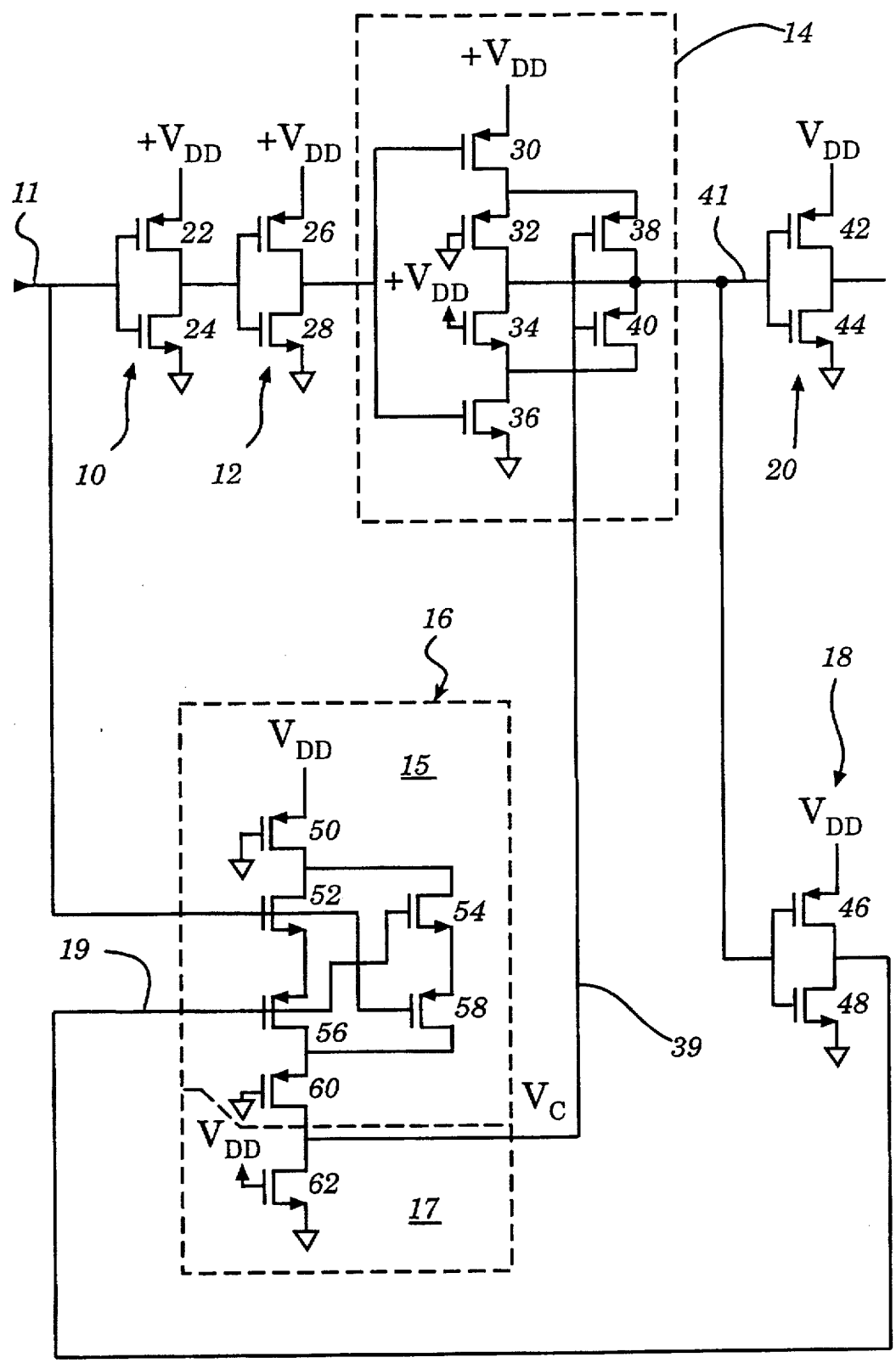
FIG. 2 is a schematic diagram representative of the present invention.

A realization of the delay circuit of FIG. 1 is described with reference to the schematic diagram of FIG. 2. First inverter 10 is made up of balanced FET devices, P-FET 22 and N-FET 24 of 0.8 μm and 0.8 μm channel lengths respectively. The FETs are balance by adjusting the channel widths thereof so as to provide inverter 10 equal output rise and fall times. The gate of P-FET 22 and the gate of N-FET 24 are both coupled to input 11. The source of P-FET 22 is tied to positive voltage supply $V_{dd}$. The drain of P-FET 22 is coupled to the drain of N-FET 24 which node acts as the output of inverter 10. N-FET 24 has its source grounded. P-FET 22 and N-FET 24 are designed with minimum channel lengths so as to provide channel resistances largely dependent upon parameters of the process by which they are made. When the processing parameters favor a worst case condition, the resulting channel lengths are at a maximum positive ΔL deviation, and thus provide maximum resistance values for the respective FETs when the FETs are fully on. On the other hand, when the processing parameters favor a best case condition, the resulting channel lengths are at an extreme negative ΔL deviation and thus provide minimum channel resistance values for the respective FETs.

The propagation delay of inverter 10 is limited by the RC time constant associated with its output resistance R (as provided by the channel resistance characteristics of either P-FET 22 or N-FET 24) working in combination with the input capacitance C of inverter 12. The input capacitance of inverter 12 is equal to the combined gate capacitances of FETs 26 and 28. As mentioned hereinbefore, because the channel resistance values are dependent upon the processing parameters by which they were made, the RC time constant for effecting the propagation delay of inverter 10 so too will be dependent upon the processing parameters.

Inverter 12 receives the output signal of inverter 10 and is made up of P-FET 26 and N-FET 28. The gate of P-FET 26 and the gate of N-FET 28 are both tied to the output of inverter 10. P-FET 26 has its source tied to the positive voltage supply $V_{dd}$ and has its drain tied to the drain of N-FET 28 which node serves as the output of inverter 12. The source of N-FET 28 is tied to ground. When the received voltage is high ($V_{dd}$), N-FET 28 is turned on while P-FET 26 is off. Therefore, the output of inverter 12 is coupled to ground via the channel of N-FET 28. On the other hand, when the received voltage is low, P-FET 26 is on while N-FET 28 is off. During this condition, the output of inverter 12 is coupled to the positive voltage supply $V_{dd}$ via the channel of P-FET 26.

FETs 26 and 28 are FETs of long channel lengths, 2.6 μm and 5.0 μm respectively. Therefore, their associated channel resistances are substantially constant with respect to variations of the fabrication process by which they were made. Note, the long channel length FETs have substantially constant channel resistances in comparison to FETs of short channel lengths. For a given signal transition, when the input signal of inverter 12 transitions from a high to low or from a low to high, the propagation delay through inverter 12 is due substantially to the characteristic RC time constant thereof. The capacitance C associated with the RC time constant is equal to the input capacitance of the variable delay inverter 14 While the output resistance R of inverter 12 is attributed to the resistance values of the long channel length FETs 26 and 28. Because the long channels of FETs 26 and 28 provide proportionately constant channel resistances over process variations with respect to short channel length FETs, the RC time constant for effecting the propagation delay of inverter 12 will likewise be viewed as constant over the process variations in comparison to the short channel length FET inverter 10.

The propagation delay of inverter 12 can be better understood by examining the circuits operation during a transition interval.. Assuming a positive output transition, N-FET 28 is turned off while P-FET 26 is turned on. The voltage present at the input of variable delay inverter 14 thus transitions from zero volts to $+V_{dd}$. Current flows through the channel of P-FET 26 in order to charge up the input capacitance of variable delay inverter 14 as associated with the gates of FETs 30 and 36. The amount of current available for charging up the input capacitance C of variable delay inverter 14 is limited by the channel resistance R of P-FET 26. The propagation delay of inverter 12 can thus can be modeled in accordance with this RC time constant. A negative going transition propagates similarly to the positive going transition except that the input capacitance of variable delay inverter 14 will be discharged instead of charged and the resistance R of the RC time constant is attributed to the channel resistance of N-FET 28 instead of P-FET 26. FETs 26 and 28 are fabricated in a balanced manner, wherein their associated channel resistances are substantially equal to each other. With equal channel resistances for FETs 26 and 28, the amount of time required for charging up the input capacitance of variable delay inverter 14 will be substantially equal to the amount of time required for discharging the input capacitance.

Variable delay inverter 14 receives the output of inverter 12 and is made up of 6 FET devices. The input of variable delay inverter 14 is tied to the gates of P-FET 30 and N-FET 36. The channels of P-PET 30 and N-FET 36 are in series with one another via intermediate FETs, P-FET 32, and N-FET 34. The source of P-FET 30 is tied to the positive supply $V_{dd}$ while its drain is tied to the source of P-FET 32. The gate of P-FET 32 is tied to ground such that P-FET 32 is always on. The drain of P-FET 32 is tied to the drain of N-FET 34 which node serves as the output node 41 of variable delay inverter 14. The gate of N-FET 34 is tied to the positive voltage supply $V_{dd}$ such that N-FET 34 is always biased on. The source of N-PET 34 is tied to the drain of common source N-FET 36. P-FETs 30 and 32 and N-PETs 34 and 36 all have long channel lengths (e.g., 2.6 μm, 2.6 μm, 5.0 μm, and 5.0 μm respectively) and, therefore, substantially constant channel on-resistance values with respect to process variations (relative short channel length FETs). In parallel with P-PET 32 is stunting P-FET 38. Likewise, in parallel with N-FET 34 is shunting P-FET 40. Shunting P-FET 38 has its source tied to the source of P-FET 32 and its drain tied to output node 41 and to the drain of P-FET 32. Shunting P-FET 40 has its drain tied to the source of N-FET 34 and its source tied to the output node 41 and to the drain of N-FET 34. Shunting P-FET 38 and shunting P-FET 40 are short channel length devices (e.g., 0.8 μm and 0.8 μm respectively) which provide shunt current paths around respective long channel length FETs 32 and 34, respectively. The gates of shunting P-FETs 38 and 40 are tied to control node 39 for receiving control voltage $V_c$. When the control voltage $V_c$ is at a maximum voltage level, both shunting P-FETs 38 and 40 are turned off and do not provide shunt paths around respective long channel length FETs 32 and 34. On the other hand, when control voltage $V_c$ at control node 39 is at a minimum voltage level, both shunting P-FETs 38 and 40 are turned on to provide shunt current paths of lower channel resistances around respective FET devices 32 and 34.

Illustrated examples will help explain the operation of variable delay inverter 14. Assuming the input to delay inverter 14 is high and that the control voltage $V_c$ is low for turning on P-FETs 38 and 40, the circuit steady state condition can be described as follows. The high input ($V_{dd}$) turns off P-FET 30 and turns on N-FET 36. The output node 41 is thus coupled to ground via a parallel combination of N-FET 34 and P-FET 40 both in series with N-FET 36. The associated output resistance of variable delay inverter 14 is therefore equal to the channel resistance of N-FET 34 in parallel with the channel resistance of shunting P-FET 40 plus the series channel resistance of N-FET 36. With the control voltage $V_c$ low, shunting P-FET 40 (of minimum channel length) provides a low resistance path in parallel with N-FET 34.

When the input to variable delay inverter 14 is low (zero volts), N-FET 36 is turned off, P-FET 30 is turned on while P-FET 32 is always enabled. Again the control voltage $V_c$ at control node 39 is assumed to be low such that shunting P-FET 38 provides a parallel circuit with P-FET 32. P-FET 32 has a long channel length and associated resistance while shunting P-FET 38 (of minimum channel length) provides a variable channel resistance in accordance with the control voltage $V_c$. The parallel channel resistances of P-FET 32 and shunting P-FET 38 are in series with the channel resistance of P-FET 30. Thus, output node 41 is tied to $+V_{dd}$ via the parallel resistance of FETs 32 and 38 in series with the channel resistance of FET 30.

Thus far, the characteristics of variable delay inverter 14 have been defined when the control voltage $V_c$ has been low for turning on shunting P-FETs 38 and 40. It can be seen that when control voltage $V_c$ is high for turning off both FETs 38 and 40, that the associated resistance of the paths to ground and $V_{dd}$ would be maximum as though FETs 38 and 40 were removed. In effect, the variable delay inverter 14 provides an output resistance defined in accordance with control voltage $V_c$ at control node 39. When $V_c$ is high, the output resistance of variable delay inverter 14 is at a maximum. On the other hand, when the control voltage $V_c$ is low for turning on both P-FETs 38 and 40, the output resistance of variable delay inverter is at a minimum.

As mentioned hereinbefore, the delay associated with propagating a transition through an inverter is defined in accordance with the inverter's characteristic RC time constant. The capacitance C of the RC time constant of variable delay inverter 14 is equal to the sum of the input capacitances associated with inverter 20 and inverter 18. The resistance R of the RC time constant is equal the output resistance of variable delay inverter 14, which output resistance changes in accordance with the control voltage $V_c$ as described hereinbefore. When the parameters of the process by which the delay circuit was fabricated favor a best case condition (wherein ΔL is negative) inverter 10 provides its minimum propagation delay and it is desired that control voltage $V_c$ be high (for turning off P-FETs 38 and 40) so that variable delay inverter 14 has its maximum output resistance for providing its maximum propagation delay. On the other hand, when the processing parameters favor a worst case condition (wherein ΔL is positive) inverter 10 provides its maximum propagation delay and it is desired, therefore, that control voltage $V_c$ be low (for turning on shunting P-FETs 38 and 40) so that variable delay inverter 14 has its minimum output resistance for providing its minimum propagation delay. Thus, when inverter 10 has a minimum propagation delay, variable delay inverter 14 provides its maximum propagation delay; and when inverter 10 has a maximum propagation delay, variable delay inverter 14 provides its minimum propagation delay. Variable delay inverter 14 accordingly provides a propagation delay that is inversely proportional to the propagation delay of inverter 10 so that the combined propagation delay of inverters 10 and 14 is constant irregardless of the processing parameters of the process by which the two devices were fabricated.

Process sense stack 16 senses the effects of the process parameters of the process by which the delay circuit is fabricated and accordingly produces control voltage $V_c$ at control node 39 for establishing the desired delay for variable delay inverter 14. Process sense stack 16 receives two inputs, a primary input at node 11 and a secondary input at node 19. The secondary input at node 19 reflects the primary input delayed by a given propagation delay as required for propagating through the overall delay circuit. Under steady state conditions, when the primary input at node 11 is high so too will the secondary input at node 19 also be high; and when the primary input at node 11 is low, so too will the secondary input at node 19 also be low. However, when the input signal received at the primary input transitions from low to high, the secondary input at node 19 remains low until the transition of the input signal propagates entirely through inverter 10, inverter 12, variable delay inverter 14 and inverter 18, upon which time the secondary input at node 19 then transitions from low to high. During this propagation interval, the primary input is high while the secondary input is low. Note that if the input were to transition from a high state to a low state, that the primary input would be low while the secondary input at node 11 would remain high during the propagation interval.

Process sense stack 16 comprises primarily a series arrangement of FET devices. P-FET 50 has its source tied to the positive voltage supply $V_{dd}$ and has its gate tied to ground such that it is always on. The drain of P-FET 50 is tied to the drains of N-FET 52 and N-FET 54. The source of N-FET 52 is tied to the source of P-FET 56 while the source of N-FET 54 is tied to the source of P-FET 58. The gate of P-FET 58 is coupled to the gate of N-FET 52 which node 11 serves as the primary input of the process sense stack. The gate of N-FET 54 is coupled to the gate of P-FET 56 which node 19 serves as the secondary input of the process sense stack. The drain of P-FET 56 and the drain of P-FET 58 are tied to the source of P-FET 60. The gate of P-FET 60 is tied to ground such that P-FET 60 is always on. The drain of P-FET 60 is coupled to the drain of N-FET 62 which node serves as the output of the process sense stack, i.e. control node 39. N-FET 62 has its source tied to ground and its gate tied to the positive supply $V_{dd}$ such that N-FET 62 is always on. All FETs between control node 39 and the positive voltage supply $V_{dd}$, i.e. FETs 50, 52, 54, 56, 58, and 60, are devices of minimum channel lengths (e.g. 0.8 μm, 0.8 μm, 0.8 μm, 0.8 μm, 0.8 μm and 0.8 μm respectively). FET 62, on the other hand, is a long channel length device (e.g. 15 μm). Therefore, the series channel resistance values of the FETs between control node 39 and the positive voltage supply $V_{dd}$ depend greatly upon parameters of the process by which they were fabricated. FET 62, in contrast, has a series channel resistance that is substantially independent of the process parameters when compared to the short channel length FETs. For negative ΔL's, wherein the actual channel lengths are below the nominal channel lengths, the series resistance of the upper series FETs is lower than a nominal value for providing a high level control voltage $V_c$ output. Conversely, for positive ΔL's, wherein the actual channel lengths are beyond the nominal channel lengths, the'series resistance of the upper series FETs is greater than a nominal value and the control voltage $V_c$ output is at a lower level. Thus, it is apparent that process sense stack 16 provides control voltage $V_c$ in accordance with the ΔL of the process by which the FET devices were fabricated. In addition, control voltage $V_c$ is output (in accordance with ΔL) only when the primary input at node 11 and the secondary input at node 19 differ. Otherwise, when both inputs are the same value, control voltage $V_c$ is output low via the channel of N-FET 62.

The primary input at node 11 is coupled to the gate of N-FET 52 and the gate of P-FET 58. When the primary input is high, N-FET 52 is turned on while P-FET 58 is turned off. Assuming a positive input transition, the secondary input which is tied to the gate of P-FET 56 and the gate of N-FET 54 remains low during the propagation interval and P-FET 56 is turned on while N-FET 54 is turned off. Accordingly, during the propagation interval, two FETs 52 and 56 are turned on in series with one another to provide a conductive path through the "exclusive OR" arrangement of FETs 52, 54, 56, and 58. For a negative input transition, N-FET 52 would be turned off while P-FET 58 would be turned on, and P-FET 56 would be turned off while N-FET 54 would be turned on during the transition interval. Thus, when the primary and secondary inputs are different from one another, either one of the series paths of FETs 52, 56, or FETs 54, 58 will be turned on. However, when the voltages at the primary and secondary inputs are the same, one FET in each series path is turned off. When both inputs are high, P-FET 58 is turned off and P-FET 56 is also turned off. If both inputs are low, N-FET 52 and N-FET 54 are turned off. Thus, in the absence of an input transition, there is no conductive path provided through the process sense stack 16—there is zero standby current. The functionality provided by the arrangement of FETs 52, 54, 56, 58, is an "exclusive OR" logic functionality, wherein the voltage divider or process sense stack 16 is operational to provide $V_c$, in accordance with the process parameters of the process by which the process sense stack was made, only when one of the primary and secondary inputs is high and the other low.

In operation, for an extreme negative ΔL, the process sense stack 16 provides, during a transition period, control $V_c$ at control node 39 at a maximum value so that variable delay inverter 14 provides its maximum propagation delay. Note that inverter 10 has its minimum propagation delay associated with this extreme negative ΔL condition. On the other hand, for an extreme positive ΔL condition, process sense stack 16 provides, during the transition interval, its minimum control voltage $V_c$. With a minimum control voltage $V_c$, FET devices 38 and 40 of variable delay inverter 14 are turned fully on so that variable delay inverter 14 provides its minimum propagation delay. Note that inverter 10 has its maximum propagation delay for the extreme positive ΔL condition.

Inverter 20 is the final inverter of the inverter chain of the delay network and comprises P-FET 42 and N-FET 44 of, for example, 0.8 µm and 0.8 µm channel lengths respectively. The gate of P-FET 42 and the gate of N-FET 44 are coupled together to node 41 and serve as the input of inverter 20 which receives the output of variable delay inverter 14. The source of P-FET 42 is coupled to the positive voltage supply Via. The source of N-FET 44 is coupled to ground. The drain of P-FET 42 is coupled to the drain of N-FET 44 which node serves as the output of inverter 20 and the output of the delay circuit.

Inverter 18, comprising P-FET 46 (e.g., 0.8 m channel length) and N-FET 48 (e.g., 0.8 µm channel length), is provided between node 41, the output of variable delay inverter 14, and node 19, the secondary input of the process sense stack 16. The source of P-FET 46 is coupled to the positive voltage supply $V_{dd}$ while the source of N-FET 48 is tied to ground. The gates of P-FET 46 and N-FET 48 are tied to node 41 to receive the output signal of variable delay inverter 14. The drain of P-FET 46 is coupled to the drain of N-FET 48 which node serves as the output of inverter 18 that drives the secondary input of process sense stack 16.

In operation, the process tolerant delay circuit receives a signal transition at its input, node 11. The propagation delays through inverter 10 and 12 are sufficient such that process sense stack 16 generates the appropriate control voltage $V_c$, for controlling variable delay inverter 14, before the transition propagates thereto. Once the transition propagates through variable delay inverter 14 and through inverter 18, the secondary input at node 19 becomes equal to the primary input at node 11 and process sense stack is disabled to a zero standby current condition. Note that process sense stack 16 dissipates power only when enabled during transition intervals of the input signal. At all other times, process sense stack 16 is disabled to a zero standby current condition.

Accordingly, what has been disclosed is a low power, minimum parts count, delay circuit that compensates for delay increases resulting from process degradations in order to provide a known delay for transitions of a signal irregardless of whether or not the process by which the delay circuit was fabricated included process deviations.

While the invention has been particularly shown and described with references to preferred embodiments thereof, it will be understood by those skilled in the art that various changes in form and details may be made therein without departing from the spirit and scope of the invention.

What is claimed is:

1. A variable delay inverter comprising:
   input and output nodes;
   first and second supply nodes;
   a P-FET having its source coupled to said first supply node, its gate coupled to said input node, and its drain coupled to a first internal node;
   a first FET having its source/drain coupled to said first internal node, its gate coupled to said second/first supply node so that it is always biased on, and its drain/source coupled to said output node;
   a first shunting FET in parallel with said first FET having its source/drain coupled to source/drain of said first FET, its drain/source coupled to said drain/source of said first FET, and its gate coupled to a control input for receiving a control signal;
   an N-FET having its source coupled to said second supply node, its gate coupled to said input node, and its drain coupled to a second internal node;
   a second FET having its source/drain coupled to said second internal node; its gate coupled to said first/second supply node so that it is always biased on, and its drain/source coupled to said output node;
   a second shunting FET in parallel with said second FET having its source/drain coupled to said source/drain of said second FET, its drain/source coupled to said drain/source of said second FET, and its gate coupled to said control input for receiving said control signal.

2. A variable delay circuit according to claim 1 wherein said first FET and said second FET have long channel lengths.

3. A variable delay circuit according to claim 2 wherein said first shunting FET and said second shunting FET have short channel lengths.

4. A variable delay circuit according to claim 1 wherein said N-FET, said P-FET, said first FET and said second FET have long channel lengths.

5. A variable delay circuit according to claim 4 wherein said first shunting FET and said second shunting FET have short channel lengths.

6. A variable delay circuit comprising:
   input and output nodes;
   first and second supply nodes for receiving first and second supply voltages respectively;
   a P-PET of a long channel length having its source coupled to said first supply node, and its gate coupled to said input node, and its drain coupled to a first internal node;
   a second P-PET of long channel length having its source coupled to said first internal node, its gate coupled to said second supply node so it is always biased on, and its drain coupled to said output node;

a shunting P-FET of short channel length coupled in parallel with said second P-FET having its source coupled to said source of said second P-PET, its drain coupled to said drain of said second P-FET, and its gate coupled to a control input for receiving a control signal;

a first N-FET having its source coupled to said second supply node, its gate coupled to said input node, and its drain coupled to a second internal node;

a second N-FET having its source coupled to said second internal node, its gate coupled to said first supply node so that it is always biased on, and its drain coupled to said output node;

a second shunting P-FET in parallel with said second N-FET having its drain coupled to said source of said second N-FET, its source coupled to said drain of said second N-FET, and its gate coupled to said control input for receiving said control signal.

* * * * *

UNITED STATES PATENT AND TRADEMARK OFFICE
CERTIFICATE OF CORRECTION

PATENT NO. : 5,663,670
DATED : Sep. 2, 1997
INVENTOR(S) : Iadanza et al.

It is certified that error appears in the above-identified patent and that said Letters Patent is hereby corrected as shown below:

Col. 10, line 60 "a P-PET" should read
--a P-FET--

Col. 10, line 64 " P-PET" should read
-- P-FET- -

Col. 11, line 3 "second P-PET" should read
--second P-FET --

Signed and Sealed this

Twelfth Day of May, 1998

Attest:

Attesting Officer

BRUCE LEHMAN

Commissioner of Patents and Trademarks